(12) United States Patent
Fontana et al.

(10) Patent No.: US 9,704,794 B2
(45) Date of Patent: Jul. 11, 2017

(54) ELECTRONIC DEVICE WITH DIE BEING SUNK IN SUBSTRATE

(71) Applicant: STMicroelectronics S.r.l., Agrate Brianza (IT)

(72) Inventors: Fulvio Vittorio Fontana, Monza (IT); Giovanni Graziosi, Vimercate (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 3 days.

(21) Appl. No.: 14/733,209

(22) Filed: Jun. 8, 2015

(65) Prior Publication Data

US 2015/0364409 A1 Dec. 17, 2015

(30) Foreign Application Priority Data

Jun. 17, 2014 (IT) .............................. MI2014A1095

(51) Int. Cl.

| | |
|---|---|
| *H01L 23/06* | (2006.01) |
| *H01L 23/04* | (2006.01) |
| *H01L 23/498* | (2006.01) |
| *H01L 23/367* | (2006.01) |
| *H01L 21/52* | (2006.01) |
| *H01L 21/48* | (2006.01) |
| *H01L 23/538* | (2006.01) |

(52) U.S. Cl.
CPC .... *H01L 23/49838* (2013.01); *H01L 21/4857* (2013.01); *H01L 21/52* (2013.01); *H01L 23/367* (2013.01); *H01L 23/3677* (2013.01); *H01L 23/49827* (2013.01); *H01L 23/5389* (2013.01); *H01L 2224/18* (2013.01)

(58) Field of Classification Search
USPC ........................................................ 257/692
See application file for complete search history.

(56) References Cited

U.S. PATENT DOCUMENTS

| | | | | |
|---|---|---|---|---|
| 6,734,534 B1 * | 5/2004 | Vu | ........................ | H01L 21/56 257/668 |
| 8,318,543 B2 * | 11/2012 | Kunimoto | ........... | H01L 21/6835 438/106 |
| 2003/0169575 A1 | 9/2003 | Ikuta et al. | | |
| 2005/0212129 A1 | 9/2005 | Huang et al. | | |
| 2006/0103008 A1 | 5/2006 | Ong et al. | | |
| (Continued) | | | | |

OTHER PUBLICATIONS

Italian Search Report and Written Opinion for IT MI2014A001095 dated Feb. 6, 2015 (7 pages).

*Primary Examiner* — Olik Chaudhuri
*Assistant Examiner* — Wilner Jean Baptiste
(74) *Attorney, Agent, or Firm* — Gardere Wynne Sewell LLP

(57) ABSTRACT

An electronic device includes a circuit integrated on a die having front and back surfaces with die terminals on the front surface. The die is embedded in a package including substrate of thermally conductive material with front and back surfaces and a through-hole. The die is sunk in the through-hole. A first insulating material layer covers the die front surface and the package front surface with first windows for accessing die terminals. Package terminals and package track are arranged on the first insulating layer. A second insulating material layer covers the first insulating layer and the package tracks with second windows for accessing the package terminals.

22 Claims, 10 Drawing Sheets

(56) References Cited

U.S. PATENT DOCUMENTS

2011/0018114 A1    1/2011   Pagaila et al.
2014/0049928 A1*   2/2014   Sawatari ................ H01L 24/19
                                                                       361/762

\* cited by examiner

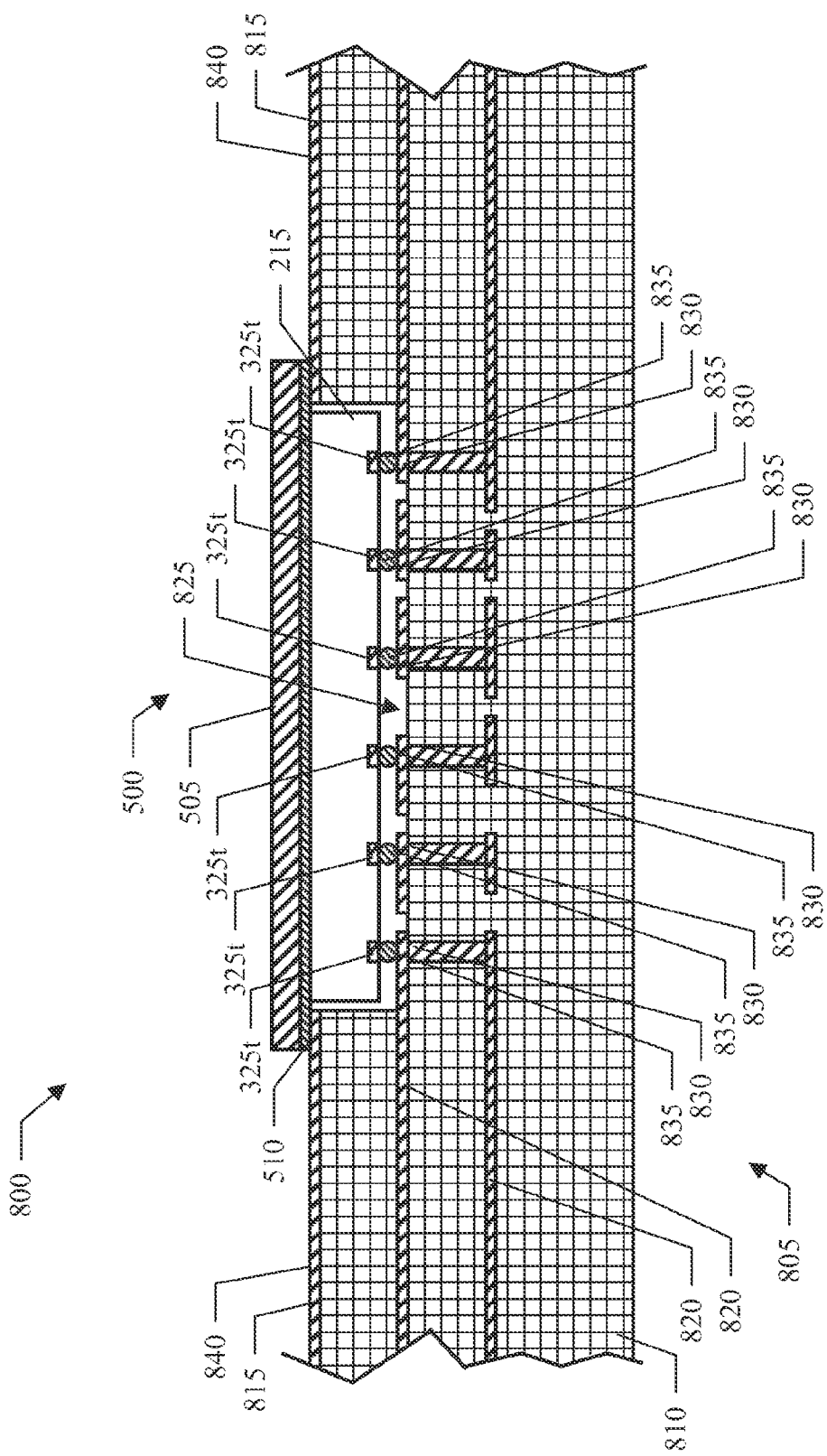

ELECTRONIC DEVICE WITH DIE BEING SUNK IN SUBSTRATE

PRIORITY CLAIM

This application claims priority from Italian Application for Patent No. MI2014A001095 filed Jun. 17, 2014, the disclosure of which is incorporated by reference.

TECHNICAL FIELD

The present disclosure relates to the field of microelectronics. More specifically, this disclosure relates to the packaging of integrated circuits.

BACKGROUND

Electronic devices are generally integrated on dice, or chips (for example, of semiconductor material). Each die may be housed in a proper package, which protects the die at the same time allowing accessing its (die) terminals. The package comprises an insulating body that embeds the die. The insulating body exposes (package) terminals, each one connected to a corresponding terminal of the die; generally, a wire-bonding technique is used wherein conductive wires are soldered at their ends each one on the corresponding terminals of the die and of the package. The terminals of the package are used to connect it (and then the corresponding terminals of the die) to external circuits. For this purpose, the electronic device is generally mounted on a Printed Circuit Board (PCB), or simply board; particularly, in the Surface-Mount Technology (SMT) the terminals of the package are soldered on (board) tracks arranged on a main surface of the board.

The packages may have different structures. For example, Flat No-leads (FN) packages are a particular type of Surface-Mount (SM) packages wherein the terminals of the packages, for example, (terminal) pads, are exposed on a front surface of the insulating body that is mounted on the board; particularly, in Quad FN (QFN) packages the pads are arranged at all four sides of the insulating body, and in QFN-Multi Row (QFN-MR) packages multiple rows of (staggered) pads are provided at each side of the insulating body. FN packages have a small (near-die scale) footprint, thin profile and low weight; this makes the FN packages very attractive in several applications (for example, in mobile devices such as smart-phones).

The electronic devices may be subject to remarkable heating during their operation (especially in power applications); therefore, the packages are generally provided with one or more heat sinks that facilitate the dissipation of the heat. For example, in the FN packages the die is mounted on a dissipation (or die) pad that is exposed on the bottom surface of the insulating body (for transferring the heat to the board). An additional heat sink may also be mounted on a back surface of the insulating body (for transferring the heat to the air). However, the insulating body generally hinders the transfer of the heat outside the package; this may reduce the performance of the electronic devices, down to cause their failure.

Moreover, the wire-bonding technique does not allow further reducing the thickness of the electronic devices. For example, the thickness of the FN packages may hardly be reduced below 0.6 mm even in Ultra-thin QFN (UQFN) packages. In this case, it also not possible to arrange the terminal pads in a central area of the insulating body (taken by the dissipation pad), with a consequent difficulty in further reducing the footprint of the FN packages.

A manufacturing process of the electronic devices may also be relatively complex, and then expensive (with a negative effect on the overall cost of the electronic devices). For example, FN packages may be manufactured from a lead-frame formed by a metal plate with a top surface that is etched to define raised areas for the (terminal and dissipation) pads. The die is attached onto the dissipation pad and its terminals are wire-bonded to the corresponding pads; the insulating body is then molded over the structure so obtained. The insulating body may embed the die completely (to reduce the manufacturing cost). Alternatively, the insulating body may be open to define a cavity housing the die; a cap is then used to seal the cavity so as to make it air-tight (to improve the performance of the electronic device). In both cases, at this point any excess metal is back-etched from the lead-frame so as to separate the terminal and dissipation pads. However, the above-described manufacturing process requires selective etching operations that are quite difficult.

SUMMARY

A simplified summary of the present disclosure is herein presented in order to provide a basic understanding thereof; however, the sole purpose of this summary is to introduce some concepts of the disclosure in a simplified form as a prelude to its following more detailed description, and it is not to be interpreted as an identification of its key elements nor as a delineation of its scope.

In general terms, the present disclosure is based on the idea of sinking the die in a substrate.

Particularly, an aspect provides an electronic device comprising a package that embeds at least one die (at least partially), wherein the package comprises a package substrate of thermally conductive material with at least one through-hole wherein the die is sunk, and one or more packages tracks that couple package terminals with corresponding die terminals.

A further aspect provides an electronic board comprising one or more of these electronic devices.

A further aspect provides an electronic system comprising one or more of these electronic devices and/or electronic boards.

A further aspect provides a method for manufacturing the electronic device.

A further aspect provides a method for manufacturing the electronic board.

More specifically, one or more aspects of the present disclosure are set out in the independent claims and advantageous features thereof are set out in the dependent claims, with the wording of all the claims that is herein incorporated verbatim by reference (with any advantageous feature provided with reference to any specific aspect that applies mutatis mutandis to every other aspect).

BRIEF DESCRIPTION OF THE DRAWINGS

The solution of the present disclosure, as well as further features and the advantages thereof, will be best understood with reference to the following detailed description thereof, given purely by way of a non-restrictive indication, to be read in conjunction with the accompanying drawings (wherein, for the sake of simplicity, corresponding elements are denoted with equal or similar references and their explanation is not repeated, and the name of each entity is generally used to denote both its type and its attributes—such as value, content and representation). In this respect, it is expressly intended that the figures are not necessary drawn to scale (with some details that may be exaggerated and/or simplified) and that, unless otherwise indicated, they are merely used to conceptually illustrate the structures and procedures described herein. Particularly:

FIG. 8 shows a schematic representation in cross-section view of a portion of an electronic board according to an embodiment of the present disclosure.

DETAILED DESCRIPTION

Figure 1A:
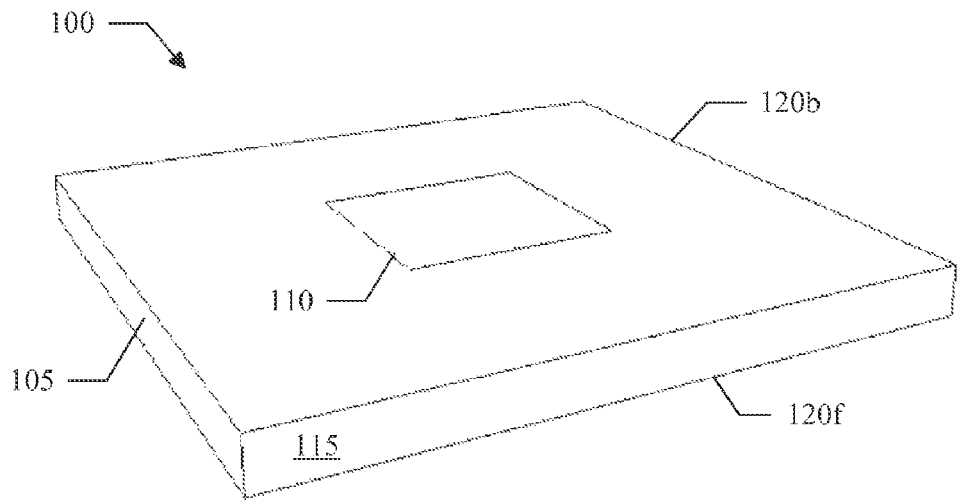
FIG. 1A-FIG. 1B show a pictorial representation in top view and in bottom view, respectively, of an electronic device according to an embodiment of the present disclosure.
Figure 1B:
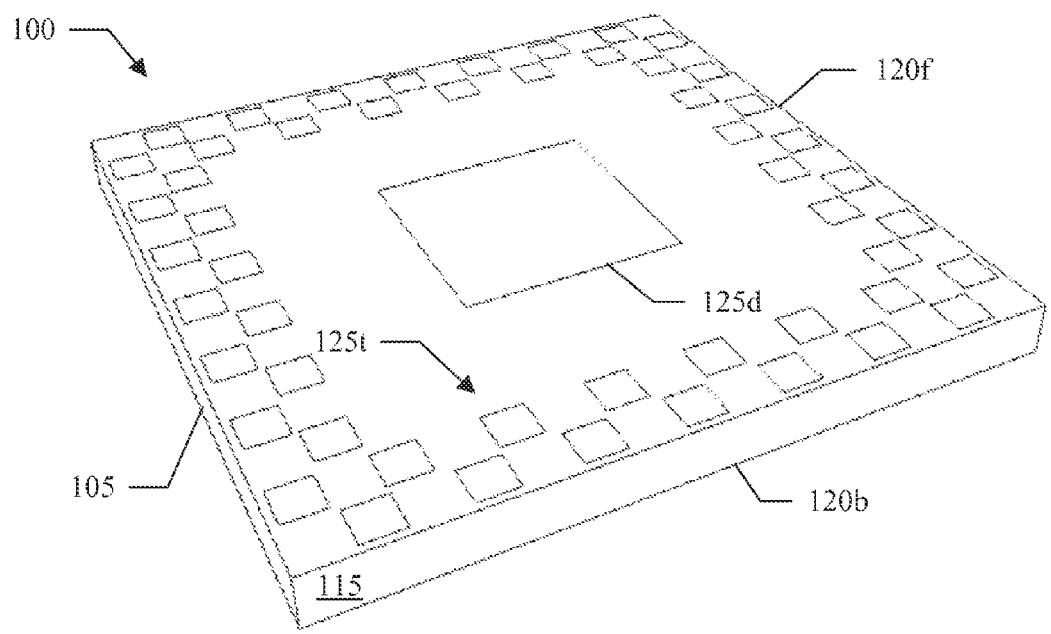

With reference in particular to the FIG. 1A-FIG. 1B, a pictorial representation is shown in top view and in bottom view, respectively, of an electronic device 100 according to an embodiment of the present disclosure.

Starting from FIG. 1A, the electronic device 100 comprises a package 105, which protects a circuit integrated on a die 110 at the same time allowing accessing its (die) terminals, not visible in the figure. Particularly, the package 105 is of the QFN-MR type. More specifically, the package 105 comprises a body 115 with a generically parallelepiped shape (for example, with a footprint of 5-10 mm×5-10 mm). The body 115 has a (front) surface 120*f*, which is used to mount the electronic device 100 on a board (not shown in the figure), and a (back) surface 120*b* opposite the surface 120*f*. The die 110 is exposed on the surface 120*f* of the body 115 (at a center thereof).

Moving to the FIG. 1B, (terminal) pads 125*t* (implementing any input/output function of the electronic device 100) are exposed on the surface 120*f* of the body 115 (for example, 50-200 each one with a size of the order of 200-500 μm×200-500 μm). In this specific case, the pads 125*t* are arranged at all four sides of the surface 120*f*; particularly, two rows of pads 125*t* are provided at each side of the surface 120*f*, staggered to each other (so as to define two concentric frames). A larger (dissipation) pad 125*d* (for transferring the heat produced by the die 110 in operation to the board) is further exposed on the surface 120*f* inside the pads 125*t* (at the center thereof).

Figure 2:
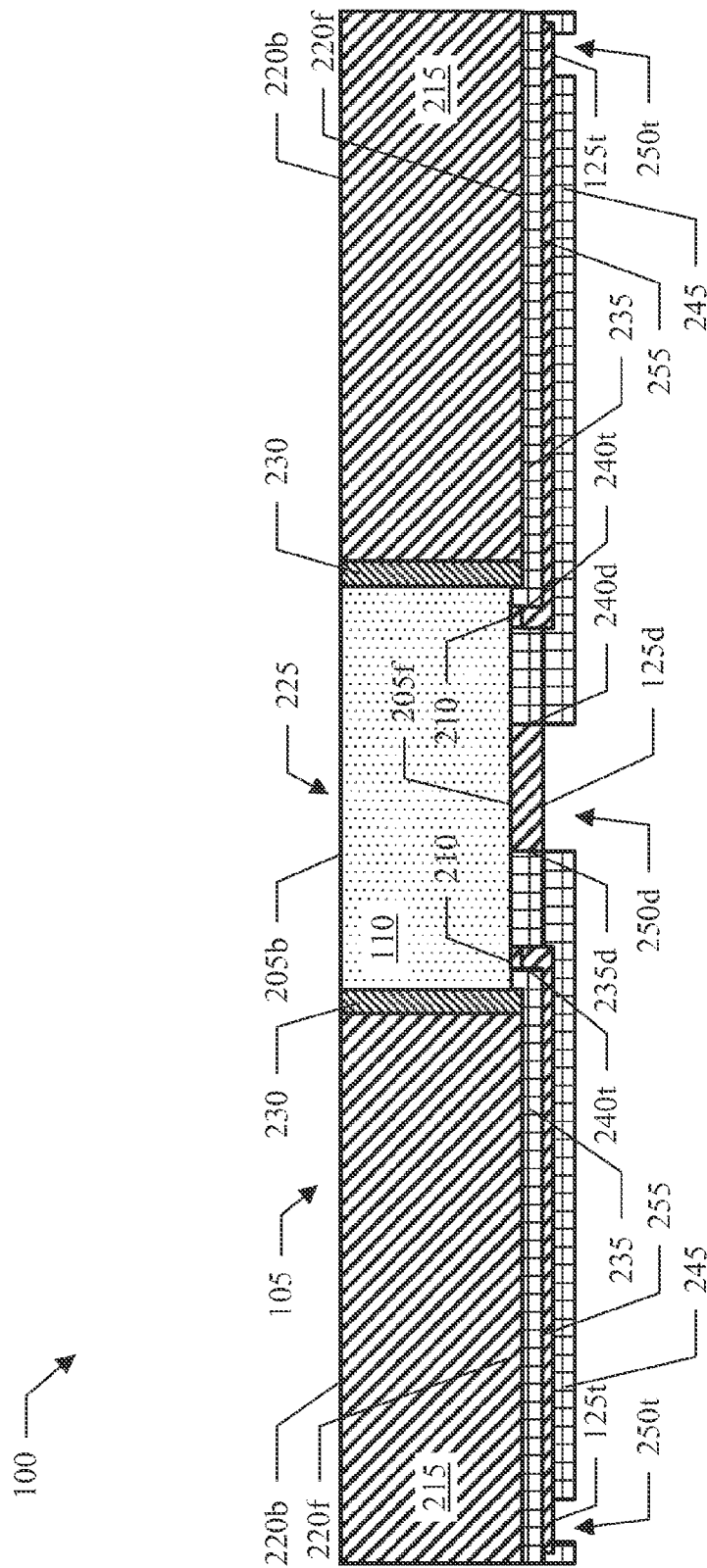
FIG. 2 shows a schematic representation in cross-section view of this electronic device.

With reference now to the FIG. 2, a schematic representation in cross-section view is shown of this electronic device 100.

The die 110 is generally made of semiconductor material (for example, silicon with a size of the order of 1-5 mm×1-5 mm×0.1-0.5 mm), whereon an integrated circuit (for example, a memory driver or a wireless controller) is formed. The die 110 has a (front) surface 205*f* and a (back) surface 205*b* opposite to each other. On the surface 205*f*, (die) terminals 210 are exposed for accessing the integrated circuit of the die 110, i.e., to exchange signals and to receive a power supply (for example, 50-200 pads with a size of the order 50-100 μm×50-100 μm); the terminals 210 are made of electrically conductive material (for example, with an electrically resistivity lower than $5 \cdot 10^{-7}$ Ωm, preferably lower than $10^{-7}$ Ωm, and still more preferably lower than $5 \cdot 10^{-8}$ Ωm), such as copper or aluminum.

In the solution according to an embodiment of the present disclosure, the package 105 comprises a (package) substrate 215 of thermally conductive material (for example, higher than 100 W/mK, preferably higher than 150 W/mK and still more preferably higher than 200 W/mK, such as 200-500 W/mK). Particularly, in a specific implementation the substrate 215 is of metal (for example, copper, nickel plated with gold, aluminum or stainless steel). The substrate 215 has a (front) surface 220*f* and a (back) surface 220*b* opposite to each other, with a thickness substantially equal to the thickness of the die 110. A through-hole 225 (or more), slightly larger than the die 110, crosses the substrate 215 between the surfaces 220*f* and 220*b*.

The die 110 is sunk in the through-hole 225. Particularly, the surface 205*b* may be flush with the surface 220*b*, and the surface 205*f* may be slightly inside the through-hole 225 so as to have the terminals 210 flush with the surface 220*f*. In this specific implementation, a filler 230 fills any (lateral) gap between the die 110 and the substrate 215; the filler 230 is made of an elastic and thermally conductive material (for example, with an elastic modulus lower than 100 MPa, preferably lower than 50 MPa, and still more preferably lower than 10 MPa, and with a thermal conductivity higher than 0.1 W/mK, preferably higher than 0.5 W/mK, and still more preferably higher than 1 W/mK), such as silicone.

An insulating layer 235 covers the surface 220*f* and the surface 205*f*; the insulating layer 235 is made of electrically insulating and thermally conductive material (for example, with an electrical resistivity higher than $10^{17}$ Ωm, preferably higher than $5 \cdot 10^{16}$ Ωm, and still more preferably higher than $10^{16}$ Ωm, and with a thermal conductivity higher than 0.1 W/mK, preferably higher than 0.5 W/mK, and still more preferably higher than 1 W/mK), such as epoxy resin. One or more windows 240*t* are opened in the insulating layer 235, each one for accessing a corresponding terminal 210; in this specific implementation, a further window 240*d* is opened in the insulating layer 235 for contacting the die 110 by the (dissipation) pad 125*d*. Another insulating layer 245 of electrically insulating material (either the same or different from the insulating layer 235) covers the insulating layer 235. One or more windows 250*t* are opened in the insulating layer 245, each one for accessing a corresponding pad 125*t*. Between the insulating layers 235 and 245, (package) tracks 255 of electrically conductive material (for example, copper of a Redistribution Layer, RDL) are arranged (i.e., sandwiched); each track 255 connects a corresponding terminal 210 (or more) to its pad 125*t*.

The sinking of the die 110 in the substrate 215 substantially increases the transfer of the heat (produced by the die 110 in operation) outside the package 105 and then its dissipation (thanks to its high thermal conductivity); this improves the performance of the electronic device 100 (reducing any risks of its failure).

At the same time, the sinking of the die 110 in the substrate 215 together with the use of the tracks 255 (for connecting the terminals 210 to the pads 125*t*) substantially reduce the thickness of the electronic device 100; particularly, the thickness of the electronic device 100 may almost reach the one of the die 110 (for example, down to 0.1-0.2 mm).

Moreover, in the specific implementation described above the filler 230 further increases the transfer of the heat from die 110 to the substrate 215 (thanks to its thermal conductivity), at the same limiting any mechanical stresses on the die 110 (thanks to its elasticity).

Figure 3A:
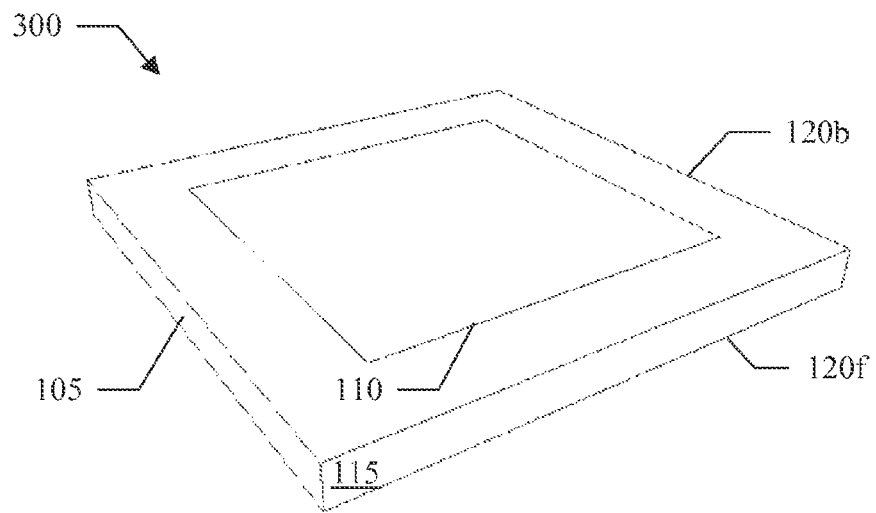
FIG. 3A-FIG. 3B show a pictorial representation in top view and in bottom view, respectively, of an electronic device according to a further embodiment of the present disclosure.
Figure 3B:
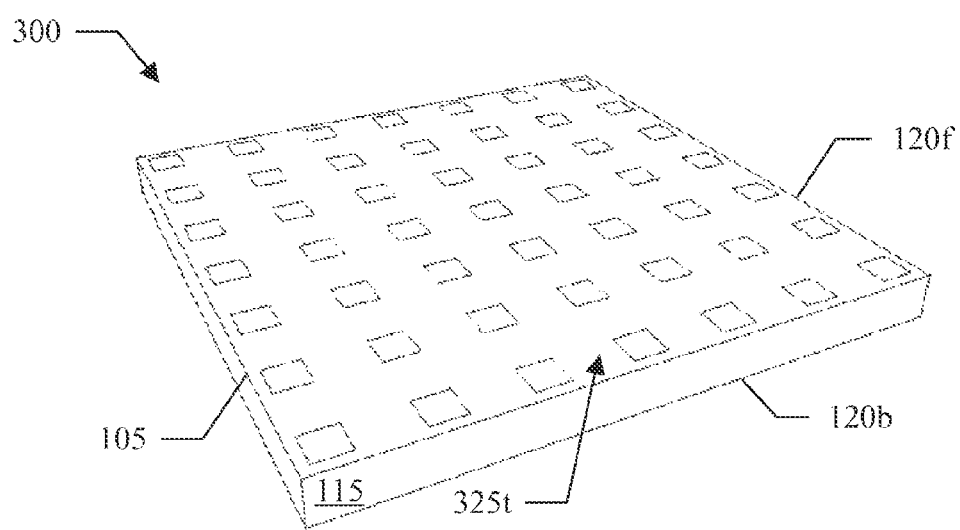

With reference now to the FIG. 3A-FIG. 3B, a pictorial representation is shown in top view and in bottom view, respectively, of an electronic device 300 according to a further embodiment of the present disclosure.

In this case (as visible in the FIG. 3B), the pads 125*t* are arranged in a matrix (or full-array) that spans across a prevalent portion of the surface 120*f* (without any dissipation pad).

Figure 4:
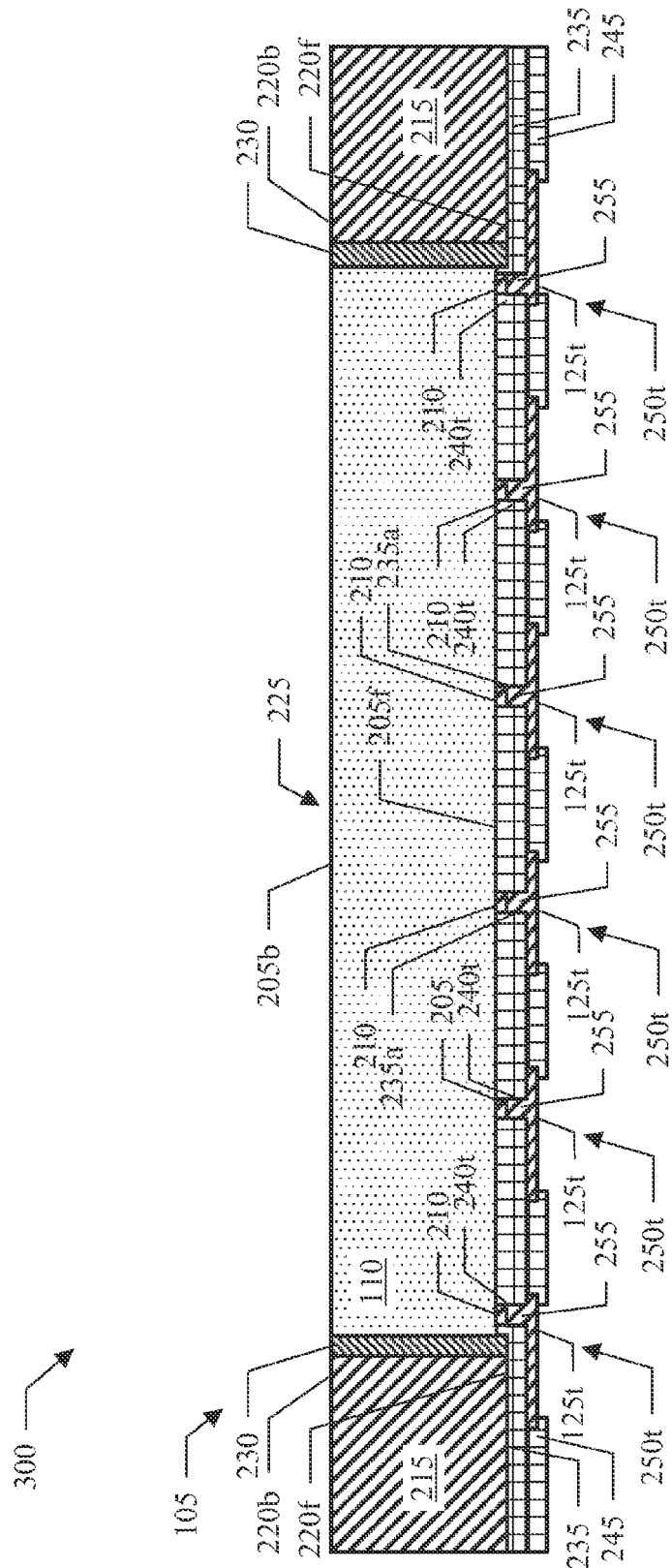
FIG. 4 shows a schematic representation in cross-section view of this electronic device.

With reference now to the FIG. 4, a schematic representation in cross-section view is shown of this electronic device 300.

The electronic device 300 is similar to the one described above, but without the windows in the insulating layers 235 and 245 for the dissipation pad.

The full-array arrangement of the pads 125*t* (made possible by the sinking of the die 110 in the substrate 215 and by the use of the tracks 255) substantially reduces the footprint of the electronic device 100 (for example, down to 2-5 mm×2-5 mm).

Figure 5:
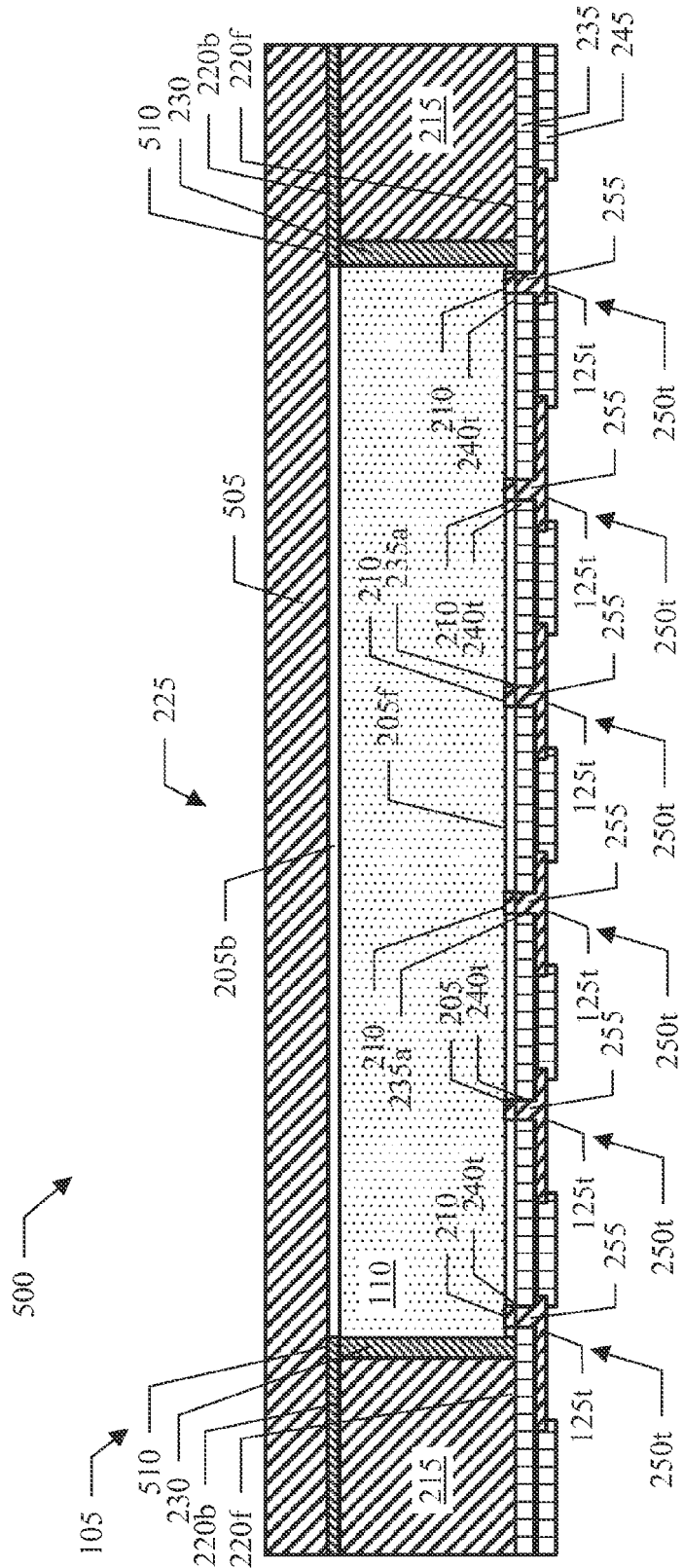
FIG. 5 shows a schematic representation in cross-section view of an electronic device according to a further embodiment of the present disclosure.

With reference now to the FIG. 5, a schematic representation in cross-section view is shown of an electronic device 500 according to a further embodiment of the present disclosure.

The electronic device 500 comprises the above-described structure of the full-array type (similar considerations apply to the structure of the QFN-MR type) with the addition of a cover element of thermally conductive material (either the same or different from the one of the substrate 215). In the specific example shown in the figure, the cover element is a plate that defines a cap 505; similar considerations apply when the cover element is a heat-sink that exposes a large heat dissipation surface (for example, with straight fins extending perpendicularly from a base thereof). The cap 505 is attached to the surface 220*b* (of the substrate 215) by an adhesive layer 510 of elastic and thermally conductive material as above (for example, silicone). As a result, a gap remains between the die 110 and the cap 505; this creates a cavity for the die 110 that is sealed by the cap 505 so as to make it air-tight (thereby improving the performance of the electronic device 500).

The cap 505 further increases the transfer of the heat (produced by the die 110 in operation) outside the package 105 and then its dissipation; this further improves the performance of the electronic device 100 (reducing any risks of its failure). Particularly the adhesive layer 510 facilitates the transfer of the heat (thanks to its thermal conductivity), at the same limiting any mechanical stresses (thanks to its elasticity).

With reference now to the FIG. 6A-FIG. 6H, the main phases are shown of a process for manufacturing an electronic device according to an embodiment of the present disclosure; particularly, the process relates to the manufacturing of the above-described electronic device of the QFN-MR type with the cap (similar considerations apply to the structure of the full-array type, with the heat-sink and/or without any cover element). In general, the manufacturing process is performed at the level of a batch of electronic devices that are packaged simultaneously in corresponding areas of a common sheet for their substrates; at the end of the manufacturing process, these areas of the sheet are separated through a cutting operation (for simplicity of description, however, in the following reference will be made only to one of such electronic devices).

Figure 6A:
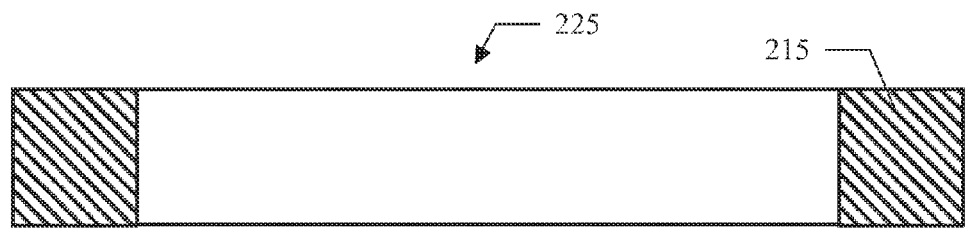
FIG. 6A-FIG. 6H show the main phases of a process for manufacturing an electronic device according to an embodiment of the present disclosure.

Starting from the FIG. 6A, the substrate 215 with the corresponding through-hole 225 (for example, obtained by punching or etching) is provided.

Figure 6B:
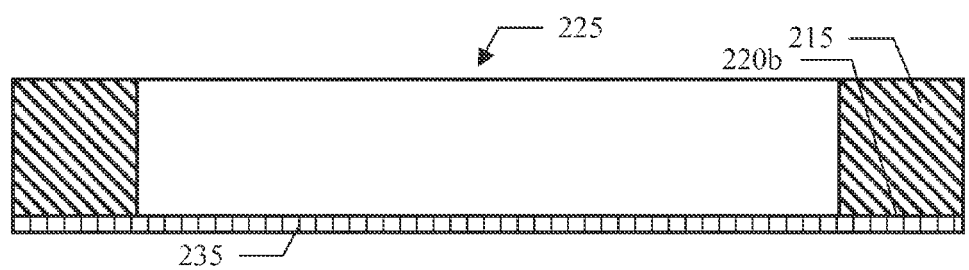

Moving to the FIG. 6B, the insulating layer 235 is applied to the whole surface 220*b* of the substrate 215; in this way, the through-hole 225 is closed at its bottom. For example, the insulating layer 235 comprises a B-stageable adhesive, which is held in place by removing the majority of its solvent by heat or Ultra-Violet (UV) light.

Figure 6C:
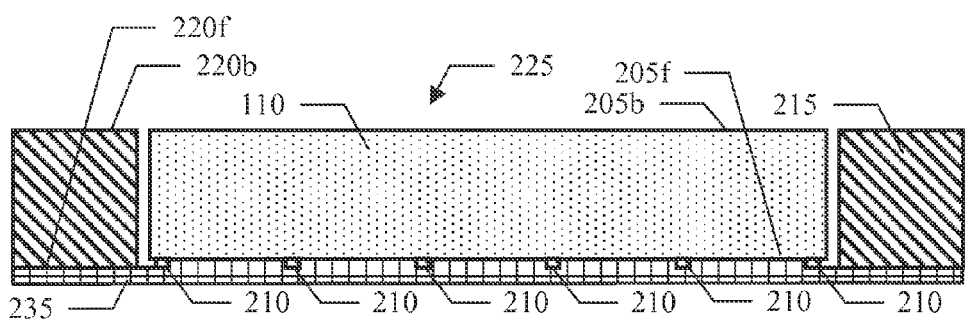

Moving to the FIG. 6C, the die 110 (with its terminals 210 facing downwards) is inserted into the center of the (closed) through-hole 225 from above, until it abuts against the insulating layer 235 (with the surface 205*b* flush with the surface 220*b*). At this point, the insulating layer 235 is cured to as to attach to the surface 220*f* (of the substrate 215) and to the surface 205*f* (of the die 110).

Figure 6D:
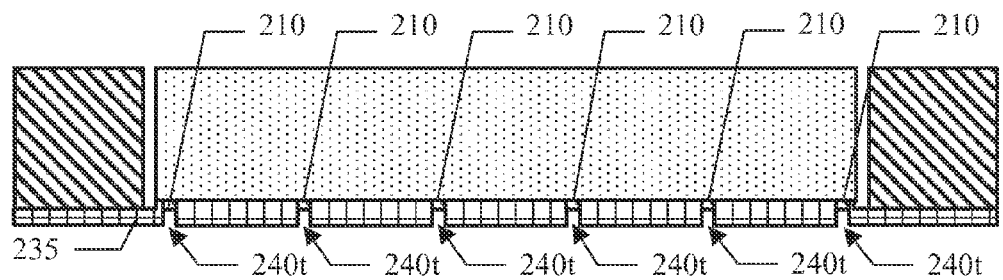

Moving to the FIG. 6D, the windows 240*t* are opened in the insulating layer 235 (for example, by laser drilling), so as to expose the terminals 210.

Figure 6E:
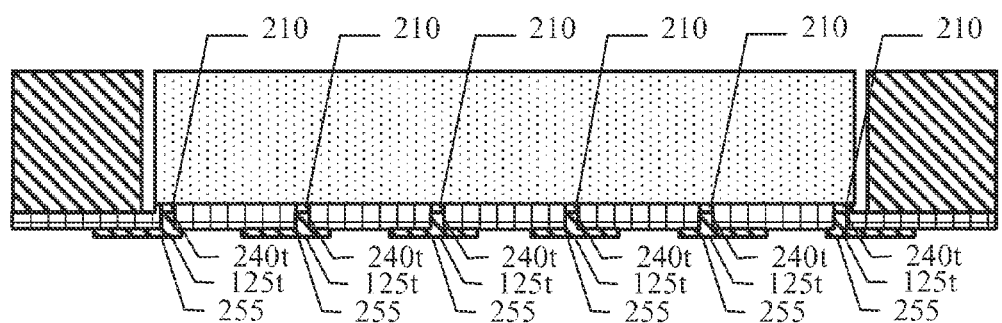

Moving to the FIG. 6E, the windows 240*t* are filled with electrical conductive material (for example, copper or silver paste); the tracks 255, ending with the pads 125*t*, are then deposited onto the insulating layer 235 (for example, by electroplating) so as to contact the terminals 210 through the electrically conductive material filling the windows 240*t*.

Figure 6F:
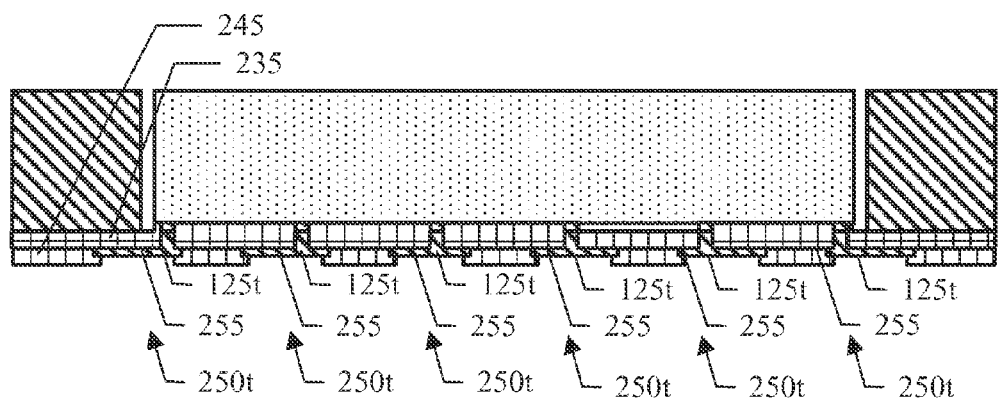

Moving to the FIG. 6F, the insulating layer 245 is deposited selectively onto the insulating layer 235 and the tracks 255 (for example, by solder mask screening), so as to define the windows 250*t* that leave the pads 125*t* exposed.

Figure 6G:
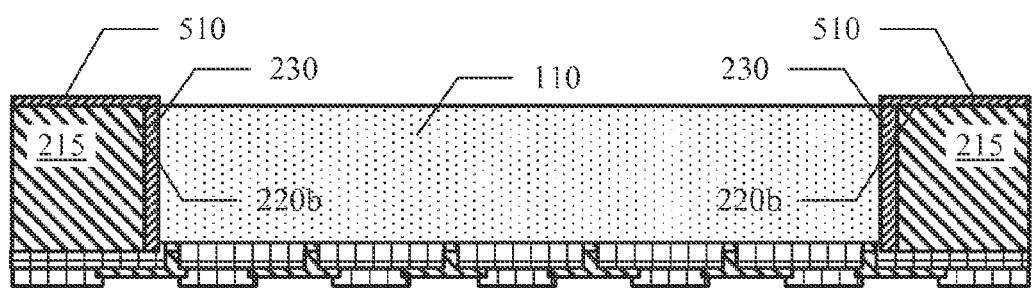

Moving to the FIG. 6G, the corresponding electrically conductive material is deposited selectively into the gap between the die 110 and the substrate 215 and onto its surface 220*b* (for example, by conductive glue screening or Conductive-Die Attach Film (C-DAF) lamination), so as to define the filler 230 and the adhesive layer 510, respectively.

Figure 6H:
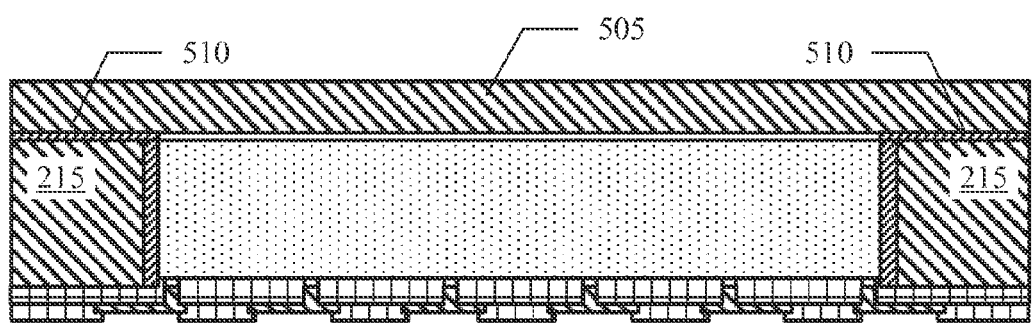

Moving to the FIG. 6H, the cap 505 is place onto the adhesive layer 510; at this point, the adhesive layer 510 is cured so as to attach the cap 505 to the substrate 215.

Figure 7A:
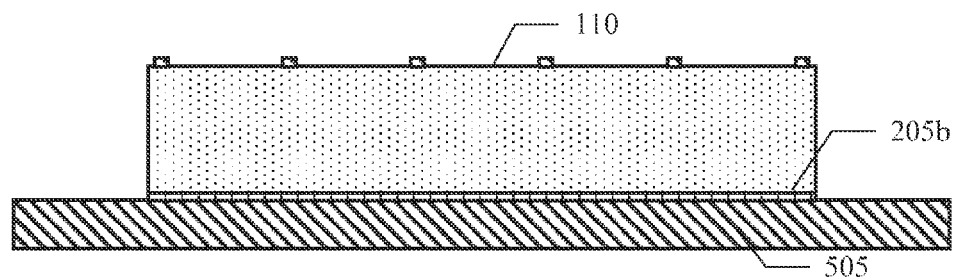
FIG. 7A-FIG. 7C show the main phases of a process for manufacturing an electronic device according to a further embodiment of the present disclosure.
Figure 7B:
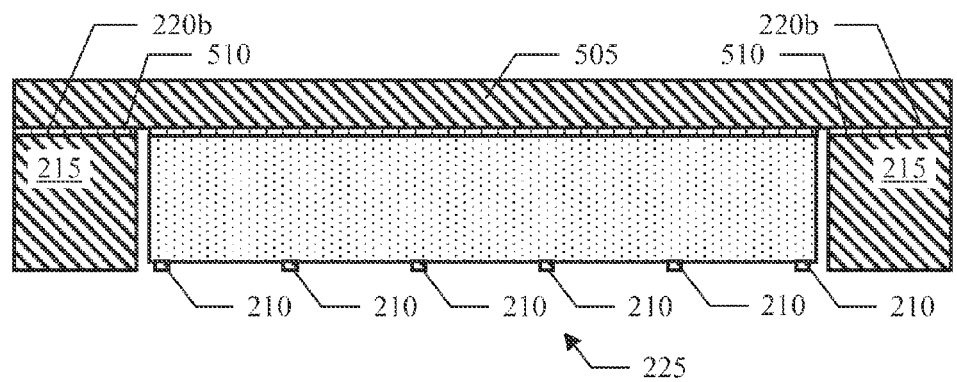
Figure 7C:
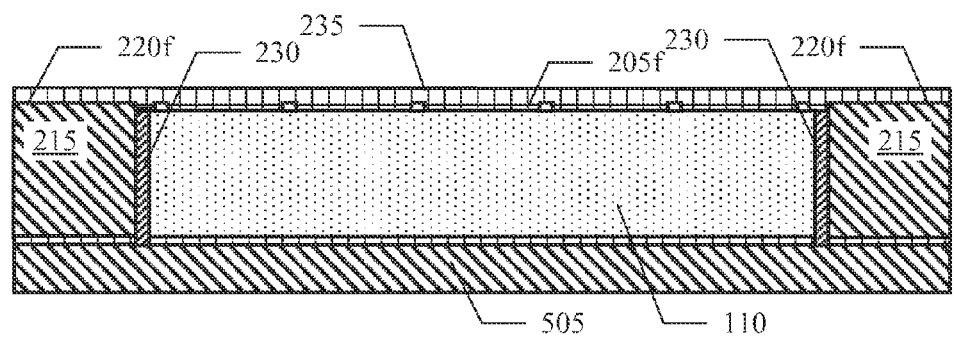

With reference now to the FIG. 7A-FIG. 7C, the main phases are shown of a process for manufacturing an electronic device according to a further embodiment of the present disclosure; in this case as well, the process relates to the manufacturing of the above-described electronic device of the QFN-MR type with the cap (similar considerations apply to the structure of the full-array type, with the heat-sink and/or without any cover element).

Starting from the FIG. 7A, the die 110 is attached with its surface 205*b* onto the cap 510 by an adhesive layer of elastic and thermally conductive material as above (for example, by glue dispensing and curing). Generally, this operation is performed at the level of a batch of dice, which are attached simultaneously onto corresponding areas of a common sheet that is then separated into their caps; the manufacturing process then continues as above by packaging the dice simultaneously in corresponding areas of a common sheet for their substrates and separating these areas (for simplicity of description, however, in the following reference will be made again only to one of such electronic devices).

Moving to the FIG. 7B, the adhesive layer 510 is applied selectively onto the surface 220*b* of the substrate 215 (for example, by conductive glue screening or Conductive-Die Attach Film (C-DAF) lamination); the die 110 (overturned with its terminals 210 facing downwards) is inserted into the center of the through-hole 225 of the substrate 210 from above, until the cap 505 abuts against the surface 220*b*. At this point, the adhesive layer 510 is cured so as to attach the cap 505 to the substrate 215.

Moving to the FIG. 7C, the corresponding electrically conductive material is deposited selectively into the gap between the die 110 and the substrate 215 (for example, by conductive glue screening or C-DAF lamination), so as to define the filler 230. The insulating layer 235 is then applied onto the whole surface 220*f* of the substrate 215 (being overturned), and it is cured to as to attach to the surface 220*f* (of the substrate 215) and to the surface 205*f* (of the die 110).

The manufacturing process then continues as above (in this case, with the cap 505 that is already attached to the substrate 215 and to the die 110 as well).

The above-described manufacturing processes are relatively simple, and then cost-effective (with a beneficial effect on the overall cost of the electronic devices).

With reference now to the FIG. 8, a schematic representation in cross-section view is shown of a portion of an electronic board 800 according to an embodiment of the present disclosure.

The electronic board 800 comprises a PCB 805; particularly, the PCB 805 comprises a (board) substrate 810 of electrically insulating material having a (main) surface 815, and one or more layers of (board) tracks 820 of electrically conductive material that are buried therein (for example, a laminate of glass fiber, resin and metal, such a copper, with a size of the order of 5-30 cm×5-30 cm×1-3 mm).

One or more of the above-described electronic devices 500 are mounted on the PCB 805 (only one shown in the figure). In this case, the cap 505 is larger than the substrate 215, so that the cap 505 projects outside the substrate 215 (from all four sides thereof); likewise, the adhesive layer 510 as well projects outside the substrate 215 so as to cover the whole projecting portion of the cap 505 (on the surface thereof facing the substrate 215).

In the solution according to an embodiment of the present disclosure, a recess 825 for each electronic device 500 extends in the substrate 810 from its surface 815; the recess 825 reaches a corresponding layer of the tracks 820, so as expose portions thereof defining lands 830 (for example, with a size of the order 200-500 µm×200-500 µm) for the pads 125*t* of the electronic device 500. The die 110 is housed in the recess 825 with its pads 125*t* facing the corresponding lands 830. The pads 125*t* are connected to the lands 830, for example, soldered thereon by means of corresponding solder bumps 835 of a solder material.

Moreover, the PCB 805 further comprises a layer of one or more (dissipation) tracks 840 of thermally conductive material (for example, the same metal of the tracks 820), which tracks 840 are arranged on the surface 815 around each recess 825 (at least in part). The projecting portion of the cap 505 is attached on the corresponding track 840 by the projecting portion of the adhesive layer 510.

For example, the above-described electronic board 800 may be assembled by mounting each electronic device 500 without its cap 505, and then attaching the cap 505 simultaneously to the (package) substrate 215 and to the (board) substrate 810.

The housing of the die 110 in the recess 825 substantially reduces a thickness of the electronic board 800 (for example, down to 1-3 mm).

Moreover, the cap 505 attached to the tracks 840 facilitates the transfer of the heat from the electronic device 500 to the PCB 805; at the same time, this increases the mechanical stability of the electronic board 800.

Naturally, in order to satisfy local and specific requirements, a person skilled in the art may apply many logical and/or physical modifications and alterations to the present disclosure. More specifically, although this disclosure has been described with a certain degree of particularity with reference to one or more embodiments thereof, it should be understood that various omissions, substitutions and changes in the form and details as well as other embodiments are possible. Particularly, different embodiments of the present disclosure may even be practiced without the specific details (such as the numerical values) set forth in the preceding description to provide a more thorough understanding thereof; conversely, well-known features may have been omitted or simplified in order not to obscure the description with unnecessary particulars. Moreover, it is expressly intended that specific elements and/or method steps described in connection with any embodiment of the present disclosure may be incorporated in any other embodiment as a matter of general design choice. In any case, ordinal or other qualifiers are merely used as labels to distinguish elements with the same name but do not by themselves connote any priority, precedence or order. Moreover, the terms include, comprise, have, contain and involve (and any forms thereof) should be intended with an open, non-exhaustive meaning (i.e., not limited to the recited items), the terms based on, dependent on, according to, function of (and any forms thereof) should be intended as a non-exclusive relationship (i.e., with possible further variables involved), the term a/an should be intended as one or more items (unless expressly indicated otherwise), and the term means for (or any means-plus-function formulation) should be intended as any entity or structure suitable for carrying out the relevant function.

For example, an embodiment provides an electronic device. The electronic device comprises at least one circuit that is integrated on a die; the die has a die front surface and a die back surface (opposed to each other), and one or more die terminals on the die front surface for accessing the integrated circuit. The electronic device comprises a package that at least partially embeds the die. The package comprises a package substrate of thermally conductive material, which has a package front surface and a package back surface (opposed to each other), and at least one through-hole that crosses the package substrate between the package front surface and the package back surface. The die is sunk in the through-hole with the die front surface and the die back surface in correspondence to the package front surface and to the package back surface, respectively. A first insulating layer (of electrically insulating material) covers the die front surface and the package front surface, with one or more first windows each one for accessing a corresponding one of the die terminals. One or more package terminals and one or more package tracks (of electrically conductive material) are arranged on the first insulating layer; each package track couples a corresponding one of the package terminals with at least a corresponding one of the die terminals. A second insulating layer (of electrically insulating material) covers the first insulating layer and the package tracks, with one or more second windows each one for accessing a corresponding one of the package terminals.

However, the electronic device may comprise any number of dice with any shape, size and of any material, each one integrating any circuit (for example, power transistors); moreover, the die may have any number of die terminals with any shape, size and of any material. The package substrate may have any size, shape and it may be of any thermally conductive material, even non-metallic; for example, the package substrate may be of any material capable of withstanding the typical SMT soldering temperatures (i.e., 200-300° C.) without melting, such as epoxy resins loaded with carbon fibers, LCD, PEEK, graphite; the package substrate may have any number of through-holes with any shape and size. The die may be sunk in the through-hole in a different way; for example, the die front surface and the die back surface may be flush, inside and/or outside the package front surface and the package back surface, respectively, provided that a substantial part of the die is within the package substrate (for example, at least 50%, preferably at least 75%, and still more preferably at least 90% of its height). The (first and second) insulating layers may be of any material and they may have any number of windows with any shape and size. The package tracks and the package terminals may be in any number (even different from the one of the die terminals), with any shape, size and of any material (for example, with package terminals in the form of balls); moreover, each package terminal may be connected to any number of die terminals (one or more).

In an embodiment, the die has one or more die lateral surfaces extending between the die front surface and the die back surface; the package further comprises a filler of elastic and thermally conductive material coupling the die lateral surfaces with the package substrate.

However, the filler may be of any material; in any case, the filler may also be omitted in a simplified implementation.

In an embodiment, the package terminals are arranged along one or more frames in correspondence to a border of the package. The package further exposes at least one dissipation element (of thermally conductive material) inside the frames; the dissipation element is coupled with the die front surface through a further first window and a further second window of the first insulating layer and of the second insulating layer, respectively.

However, the package terminals may be arranged along any number of frames with any size and shape; moreover, the dissipation element may be of any material, with any shape and size, in any number and at any position.

In an embodiment, the package terminals are arranged in a matrix on a prevalent portion of the package.

However, the matrix may have any number of rows and columns.

More generally, the package terminals may be arranged in any other ways (for example, in one or two rows), either completely under the package substrate or even folding around its edges; moreover, the dissipation element(s) may be either provided or omitted with any arrangement of the package terminals.

In an embodiment, the package further comprises a cover element (of thermally conductive material) covering the die back surface and the package back surface.

However, the cover element may be of any material, with any shape and size (either smaller or larger than the package substrate), in any number and at any position; particularly, the cover element may be a cap, a heat-sink (of any type, for example, with flared fins), or any combination thereof. In any case, an implementation without any cover element is not excluded.

In an embodiment, the cover element is attached to the package back surface; the cover element is spaced apart from the die back surface thereby defining a sealed cavity for the die.

However, the cover element may be attached to the package back surface in any way (for example, by soldering); in any case, nothing prevents attaching the cover element to the die as well.

A further embodiment provides an electronic board. The electronic board comprises a board substrate of electrically insulating material (with a main surface) and one or more board tracks of electrically conductive material arranged in at least one layer embedded in the board substrate. The electronic board comprises one or more of the above-described electronic devices, which are mounted on the board substrate with each package terminal coupled with one of the board tracks. The substrate has one or more recesses that extend from the main surface to expose corresponding portions of the board tracks; each electronic device is housed in a corresponding one of the recesses with the package terminals coupled with the corresponding exposed portion of the board tracks.

However, the board substrate may be of any material, with any shape and size; moreover, it may have board tracks of any material, with any shape and size, in any number and arranged in any layers. The electronic board may comprise any number of electronic devices (of any type, even different one to another), each one housed in a recess of any shape and size (for example, with the electronic device that projects above the main surface of the board substrate).

In an embodiment, the electronic devices are with the cover element having a projecting portion that projects outside the package substrate. The electronic board further comprises at least one dissipation layer (of thermally conductive material) arranged on the main surface, at least in part around each recess; each electronic device has the projecting portion of the cover element attached on the dissipation layer around the corresponding recess.

However, the dissipation layers may be of any material, with any shape and size, in any number and at any position (from covering the whole main surface to only around each recess or parts thereof). In any case, the possibility of omitting the dissipation layers or even leaving the electronic devices uncovered is not excluded.

It should be noted that the electronic devices are suitable to be put on the market as stand-alone products, for their use in any type of electronic boards (of the standard type as well), or in any other applications. Vice-versa, the same board substrate may also be used to house electronic devices of any other type in its recesses.

A further embodiment provides an electronic system comprising one or more of these electronic devices and/or electronic boards.

However, the electronic system may be of any type (for example, for power applications).

Generally, similar considerations apply if the electronic device, the electronic board and/or the electronic system each one has a different structure or comprises equivalent components, or it has other operative characteristics. In any case, every component thereof may be separated into more elements, or two or more components may be combined together into a single element; moreover, each component may be replicated to support the execution of the corresponding operations in parallel. Moreover, unless specified otherwise, any interaction between different components generally does not need to be continuous, and it may be either direct or indirect through one or more intermediaries.

A further embodiment provides a method for manufacturing an electronic device. The method comprises the following steps. A package substrate of thermally conductive material is provided; the package substrate has a package front surface and a package back surface opposed to each other, and at least one through-hole crossing the package substrate between the package front surface and the package back surface. A first insulating layer of electrically insulating material is applied onto the package front surface thereby closing the through-hole. At least one die whereon a circuit is integrated (which die has a die front surface and a die back surface opposed to each other, and one or more die terminals on the die front surface for accessing the integrated circuit) is sunk into the through-hole with the die front surface and the die back surface in correspondence to the package front surface and to the package back surface, respectively. One or more first windows are opened in the first insulating layer each one for accessing a corresponding one of the die terminals. One or more package terminals and one or more package tracks of electrically conductive material are formed onto the first insulating layer; each package track couples a corresponding one of the package terminals with at least a corresponding one of the die terminals. A second insulating layer of electrically insulating material is applied onto the first insulating layer and the package tracks; the second insulating layer has one or more second windows each one for accessing a corresponding one of the package terminals.

A further embodiment provides a method for manufacturing an electronic device. The method comprises the following steps. A package substrate of thermally conductive material is provided; the package substrate has a package front surface and a package back surface opposed to each other, and at least one through-hole crossing the package substrate between the package front surface and the package back surface. At least one die whereon a circuit is integrated (which die has a die front surface and a die back surface opposed to each other, and one or more die terminals on the die front surface for accessing the integrated circuit) is attached onto a cover element of thermally conductive material having a projecting portion projecting outside the die. The die is sunk into the through-hole with the die front surface and the die back surface in correspondence to the package front surface and to the package back surface, respectively. The projecting portion of the cover element is attached to the package back surface. A first insulating layer of electrically insulating material is applied onto the package front surface thereby closing the through-hole. One or more first windows are opened in the first insulating layer each one for accessing a corresponding one of the die terminals. One or more package terminals and one or more package tracks of electrically conductive material are formed onto the first insulating layer; each package track couples a corresponding one of the package terminals with at least a corresponding one of the die terminals. A second insulating layer of electrically insulating material is applied onto the first insulating layer and the package tracks; the second insulating layer has one or more second windows each one for accessing a corresponding one of the package terminals.

However, the electronic device may be manufactured with different methods (for example, by attaching the first insulating layer to the die terminals only, by forming the different layers selectively or by patterning them).

Similar considerations apply to the manufacturing of the electronic board (for example, obtained by mounting the electronic devices already provided with their caps).

Generally, equivalent methods may be used (with similar steps having the same functions of more steps or portions thereof, removing some steps being non-essential, or adding further optional steps); moreover, the steps may be performed in a different order, concurrently or in an interleaved way (at least in part).

The invention claimed is:

1. An electronic device, comprising:
   at least one circuit being integrated on a die, the die having a die front surface and a die back surface opposed to each other, one or more die lateral surfaces extending between the die front surface and the die back surface, and one or more die terminals on the die front surface for accessing the integrated circuit;
   a package including a package substrate of thermally conductive material having a package front surface and a package back surface opposed to each other and at least one through-hole crossing the package substrate between the package front surface and the package back surface;
   wherein the die is sunk in the through-hole with the die front surface and the die back surface in correspondence to the package front surface and to the package back surface, respectively;
   a first insulating layer of electrically insulating material covering the die front surface and the package front surface with one or more first windows each one for accessing a corresponding one of the die terminals;
   one or more package terminals;
   one or more package tracks of electrically conductive material arranged on the first insulating layer, each package track coupling a corresponding one of the package terminals with at least a corresponding one of the die terminals;
   a second insulating layer of electrically insulating material covering the first insulating layer and the package tracks with one or more second windows each one for accessing a corresponding one of the package terminals; and
   a filler of elastic and thermally conductive material coupling the die lateral surfaces with side walls of the through-hole of the package substrate, the elastic and thermally conductive material conducting heat from the die to the package substrate.

2. The electronic device according to claim 1, wherein the package terminals are arranged along one or more frames in correspondence to a border of the package, and wherein the package further exposes at least one dissipation element of thermally conductive material inside the frames, the dissipation element being coupled with the die front surface through a further first window and a further second window of the first insulating layer and of the second insulating layer, respectively.

3. The electronic device according to claim 1, wherein the package terminals are arranged in a matrix on a prevalent portion of the package.

4. The electronic device according to claim 1, wherein the package further comprises a cover element of thermally conductive material covering the die back surface and the package back surface.

5. The electronic device according to claim 4, wherein the cover element is attached on the package back surface, the cover element being spaced apart from the die back surface thereby defining a sealed cavity for the die.

6. The electronic device of claim 1, further comprising:
   an electronic board including a board substrate of electrically insulating material having a main surface, one or more board tracks of electrically conductive material arranged in at least one layer embedded in the board substrate and a recess extending from the main surface to expose corresponding portions of the board tracks;

wherein said package is housed in said recess with the package terminals in electrical connection with the exposed corresponding portions of the board tracks.

7. The electronic device according to claim 6, wherein the package further comprises a cover element of thermally conductive material covering the die back surface and the package back surface, said cover element having a projecting portion projecting outside the package substrate and extending over said main surface of the board substrate.

8. The electronic device according to claim 7, further comprising at least one dissipation layer of thermally conductive material arranged on the main surface at least in part around said recess.

9. The electronic device according to claim 8, wherein the projecting portion of the cover element is attached on the dissipation layer around the recess.

10. The electronic device of claim 1 wherein the filler of elastic and thermally conductive material has a thermal conductivity greater than 0.5 W/mK.

11. The electronic device of claim 10 wherein the filler of elastic and thermally conductive material has a thermal conductivity greater than 1 W/mK.

12. The electronic device of claim 1 wherein the filler of elastic and thermally conductive material is silicone.

13. An electronic device, comprising:
at least one integrated circuit die having a die front surface, a die back surface opposed to the die front surface and a die edge surface extending between the die front surface and the die back surface and further having die electrical terminals on the die front surface;
a package substrate made of a thermally conductive material having a package front surface and a package back surface opposed to each other and further having a through-hole crossing the package substrate between the package front surface and the package back surface;
wherein the integrated circuit die is positioned within the through-hole;
a filler of elastic and thermally conductive material coupling the die edge surface to a wall of the through-hole, the filler of elastic and thermally conductive material conducting heat from the integrated circuit die to the package substrate;
a first insulating layer of electrically insulating material covering at least a portion of the die front surface and the package front surface, said first insulating layer including first windows for accessing corresponding die electrical terminals;
package electrical terminals arranged on the first insulating layer;
package electrical tracks arranged on the first insulating layer for making electrical connections between the die electrical terminals and the package electrical terminals;
a second insulating layer of electrically insulating material covering the first insulating layer and the package tracks, said second insulating layer including second windows for accessing corresponding package electrical terminals; and
wherein the package substrate and the filler of elastic and thermally conductive material fully support the at least one integrated circuit die.

14. The electronic device of claim 13, wherein the die back surface is coplanar with the package back surface.

15. The electronic device of claim 14, further comprising a cover element made of a thermally conductive material covering the coplanar die back surface and the package back surface.

16. The electronic device of claim 15, wherein the cover element is attached on the package back surface, the cover element being spaced apart from the die back surface thereby defining a sealed cavity for the die.

17. The electronic device of claim 13, wherein the die front surface is recessed with respect to the package front surface.

18. The electronic device of claim 13, wherein the die front surface further includes a heat dissipation terminal, and wherein the first windows are further for accessing the heat dissipation terminal.

19. The electronic device of claim 18, wherein the second windows are further for accessing the heat dissipation terminal.

20. The electronic device of claim 13 wherein the filler of elastic and thermally conductive material is silicone.

21. An electronic device, comprising:
at least one circuit being integrated on a die, the die having a die front surface and a die back surface opposed to each other and one or more die terminals on the die front surface for accessing the integrated circuit;
a package including a package substrate of thermally conductive material having a package front surface and a package back surface opposed to each other and at least one through-hole crossing the package substrate between the package front surface and the package back surface;
wherein the die is sunk in the through-hole with the die front surface and the die back surface in correspondence to the package front surface and to the package back surface, respectively;
a first insulating layer of electrically insulating material covering the die front surface and the package front surface with one or more first windows each one for accessing a corresponding one of the die terminals;
one or more package terminals;
one or more package tracks of electrically conductive material arranged on the first insulating layer, each package track coupling a corresponding one of the package terminals with at least a corresponding one of the die terminals;
a second insulating layer of electrically insulating material covering the first insulating layer and the package tracks with one or more second windows each one for accessing a corresponding one of the package terminals; and
a cover element of thermally conductive material covering the die back surface and the package back surface, the cover element being attached on the package back surface and disposed spaced apart from the die back surface thereby defining a sealed cavity for the die.

22. The electronic device of claim 13, wherein the electronic device does not include an additional support structure adhered to the die back surface.

* * * * *